(12) United States Patent
Marukame et al.

(10) Patent No.: US 8,330,196 B2
(45) Date of Patent: Dec. 11, 2012

(54) SEMICONDUCTOR DEVICE AND METHOD OF MANUFACTURING THE SAME

(75) Inventors: Takao Marukame, Tokyo (JP); Mizue Ishikawa, Yokohama (JP); Tomoaki Inokuchi, Kawasaki (JP); Hideyuki Sugiyama, Kawasaki (JP); Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/419,947

(22) Filed: Mar. 14, 2012

(65) Prior Publication Data

US 2012/0168838 A1 Jul. 5, 2012

Related U.S. Application Data

(63) Continuation of application No. PCT/JP2009/066249, filed on Sep. 18, 2009.

(51) Int. Cl.
*H01L 29/772* (2006.01)
*H01L 21/336* (2006.01)

(52) U.S. Cl. ............... 257/295; 257/314; 257/E21.409; 257/E29.242; 438/3

(58) Field of Classification Search .............. 257/295, 257/314, E21.409, E29.242; 438/3
See application file for complete search history.

(56) References Cited

U.S. PATENT DOCUMENTS

| | | | | |
|---|---|---|---|---|
| 6,963,091 B1 * | 11/2005 | Vashchenko et al. | ......... | 257/213 |
| 7,022,532 B1 * | 4/2006 | Vashchenko et al. | ............. | 438/3 |
| 7,602,636 B2 * | 10/2009 | Saito et al. | .................... | 365/158 |
| 7,750,390 B2 * | 7/2010 | Saito et al. | .................... | 257/314 |
| 7,956,395 B2 * | 6/2011 | Inokuchi et al. | ............... | 257/295 |
| 2004/0041217 A1 * | 3/2004 | Lee et al. | ........................ | 257/414 |
| 2006/0220161 A1 * | 10/2006 | Saito et al. | ..................... | 257/421 |
| 2008/0061869 A1 * | 3/2008 | Takatori | ........................ | 327/544 |
| 2008/0062580 A1 * | 3/2008 | Inokuchi et al. | ............ | 360/324.2 |
| 2008/0239930 A1 * | 10/2008 | Saito et al. | ..................... | 369/126 |

(Continued)

FOREIGN PATENT DOCUMENTS

JP 2009-054960 3/2009

(Continued)

OTHER PUBLICATIONS

S. Sugahara; Spin metal-oxide-semiconductor field-effect transistors (spin MOSFETs) for integrated spin electronics; Aug. 2005; IEE Proc.—Circuits Devices Syst., vol. 152, No. 4.*

(Continued)

*Primary Examiner* — Olik Chaudhur
*Assistant Examiner* — Pauline Vu
(74) *Attorney, Agent, or Firm* — Oblon, Spivak, McClelland, Maier & Neustadt, L.L.P.

(57) ABSTRACT

A semiconductor device according to an embodiment includes: a semiconductor layer; source and drain regions in the semiconductor layer; a magnetic metal semiconductor compound film on each of the source and drain regions, the magnetic metal semiconductor compound film including the same semiconductor as a semiconductor of the semiconductor layer and a magnetic metal; a gate insulating film on the semiconductor layer between the source region and the drain region; a gate electrode on the gate insulating film; a gate sidewall formed at a side portion of the gate electrode, the gate sidewall being made of an insulating material; a film stack formed on the magnetic metal semiconductor compound film on each of the source and drain regions, the film stack including a magnetic layer; and an oxide layer formed on the gate sidewall, the oxide layer containing the same element as an element in the film stack.

20 Claims, 13 Drawing Sheets

U.S. PATENT DOCUMENTS

2010/0171158 A1* 7/2010 Sugahara et al. ............. 257/295
2010/0200899 A1* 8/2010 Marukame et al. ........... 257/295

FOREIGN PATENT DOCUMENTS

JP          2010034152       *  2/2010
WO    WO 2008/123321           10/2008

OTHER PUBLICATIONS

International Search Report issued Dec. 15, 2009 in PCT/JP2009/066429 filed Sep. 18, 2009.

Peter Kratzer, et al.; "Transition-metal silicides as materials for magnet-semiconductor heterostructures"; Journal of Applied Physics, 2007, vol. 101, pp. 081725-1-081725-5.

T. Ohguro, et al.; "Ultra-shallow junction and salicide techniques for advanced CMOS devices"; Electrochemical Society Proceedings, 1997, vol. 97-3, pp. 275-295.

The International Preliminary Report on Patentability and Written Opinion issued Apr. 19, 2012, in International application No. PCT/JP2009/066429 (English translation) (International filing date Sep. 18, 2009).

\* cited by examiner

SEMICONDUCTOR DEVICE AND METHOD OF MANUFACTURING THE SAME

CROSS-REFERENCE TO RELATED APPLICATION

This application is a continuation application based upon and claims the benefit of priority from prior PCT/JP 2009/066429 filed on Sep. 18, 2009, the entire contents of which are incorporated herein by reference.

FIELD

Embodiments described herein relate generally to a semiconductor device and a method of manufacturing the semiconductor device.

BACKGROUND

In a spin MOSFET, the source and drain (S/D) electrodes are made of a magnetic material (a spin-polarized material) so that the transistor drive current can be varied depending on the relative magnetization configuration of the S/D electrodes. Spin MOSFETs are used in reconfigurable logics such as FPGAs (Field Programmable Gate Arrays).

In the S/D forming process for conventional CMOSs, a salicide (self-aligned silicide) process is normally used. In this process, a metal layer made of Co, Ni, or the like is formed after the formation of gate electrodes, and the metal layer is made to react with Si through a heat treatment, so as to form silicide. By this technique, the unreacted portions of the metal layer on the gate sidewalls are selectively dissolved in chemical solutions such as an acid, but the silicide is not dissolved in chemical solutions. Therefore, stack electrodes formed by stacking Si and silicide are formed in a self-aligning manner with respect to the Si surface of the foundation layer. Accordingly, MOSFETs can be formed, regardless of the alignment accuracy of lithography in the formation of contacts with Si. As the silicide, $CoSi_2$, NiSi, or the like is used (see T. Ohguro, et al., "Ultra-shallow junction and silicide techniques for advanced CMOS devices," Proceedings of the Sixth International Symp. On Ultralarge Scale Integration Science and Technology, the Electrochemical Society of Japan, pp. 275-295, 1997, for example).

Meanwhile, materials having high spin polarization of conduction electrons at room temperature are used for the electrodes of spin MOSFETs, and Co-based or Fe-based metal magnetic films are normally used. If Co, Fe, or CoFe alloy are silicided by using the same technique as that used in conventional MOSFETs, the resultant material is normally a non-magnetic material, and the spin polarization becomes much lower. Even if high spin polarization is achieved by adjusting the composition of the silicide in a suitable manner, the composition becomes a metal-rich composition, and the resistance to acid cannot be achieved. That is, in the procedures for manufacturing spin MOSFETs, the process to form the S/D electrodes in a self-aligning manner through the same silicide reaction as those in conventional CMOSs cannot be used.

To practically use spin MOSFETs in LSIs, a self-alignment process is essential, but any reliable technique has not been proposed so far. Conventionally, there has been a well-known technique for forming the S/D shapes by photolithography and ion milling (see JP-A 2008-66596 (KOKAI), for example). By this technique, however, alignment with a FEOL (Front End of Line) is difficult, and accumulation of sophisticated technologies is necessary to avoid decreases in yield.

Miniaturization of spin MOSFETs is essential in fabricating large-scale production and obtaining higher performance. To achieve the miniaturization, there are demands for semiconductor devices that have magnetic S/D electrodes formed in a self-aligning manner, and methods of manufacturing the semiconductor devices.

DETAILED DESCRIPTION

A method of manufacturing a semiconductor device according to an embodiment includes: forming a gate insulating film on a first semiconductor layer in a substrate; forming a gate electrode on the gate insulating film; forming a gate sidewall at a side portion of the gate electrode, the gate sidewall being made of an insulating material; forming a magnetic metal film on regions to be source and drain regions in the first semiconductor layer and on the gate sidewall; performing a first heat treatment to turn the magnetic metal film on the regions in the first semiconductor layer into a first magnetic metal semiconductor compound film and leave the magnetic metal film on the gate sidewall, the first magnetic metal semiconductor compound film containing a magnetic metal element of the magnetic metal film; forming a semiconductor film on the first magnetic metal semiconductor compound film and on the magnetic film on the gate sidewall after the formation of the first magnetic metal semiconductor compound film, the semiconductor film including the same semiconductor as a semiconductor of the first semiconductor layer; performing a second heat treatment to turn a surface part of the first magnetic metal semiconductor compound film into a second magnetic metal semiconductor compound film, and turn the magnetic metal film on the gate sidewall into a third magnetic metal semiconductor compound film, the semiconductor in the second magnetic metal semiconductor compound film having a higher concentration than a concentration of the semiconductor in the first magnetic metal semiconductor compound film, the semiconductor in the third magnetic metal semiconductor compound film having a lower concentration than the concentration of the semiconductor in the second magnetic metal semiconductor compound film; and removing the third magnetic metal semiconductor compound film on the gate sidewall.

The following is a description of embodiments, with reference to the accompanying drawings.

First Embodiment

FIGS. 1 through 11 illustrate a method of manufacturing a semiconductor device according to a first embodiment. The manufacturing method according to this embodiment is designed for manufacturing semiconductor devices including spin CMOSFETs.

Figure 1:
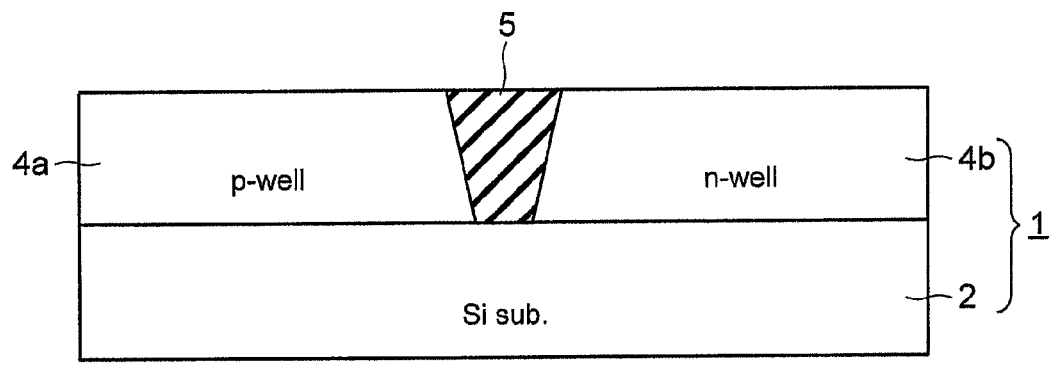
FIG. 1 is a cross-sectional view illustrating a method of manufacturing a semiconductor device according to a first embodiment.

First, as shown in FIG. 1, a semiconductor layer 4a to be a p-well and a semiconductor layer 4b to be an n-well are formed on a silicon substrate 2. Device isolation is performed on those semiconductor layers 4a and 4b with a device isolating region 5. In this manner, a semiconductor substrate 1 is prepared.

Figure 2:
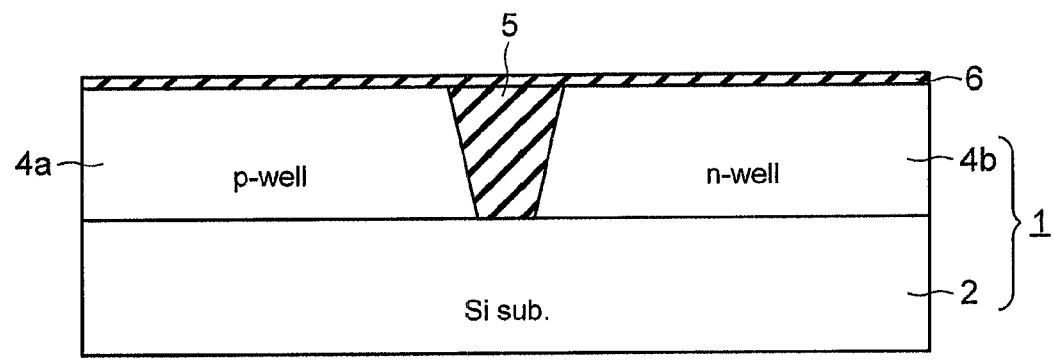
FIG. 2 is a cross-sectional view illustrating a method of manufacturing a semiconductor device according to the first embodiment.
Figure 3:
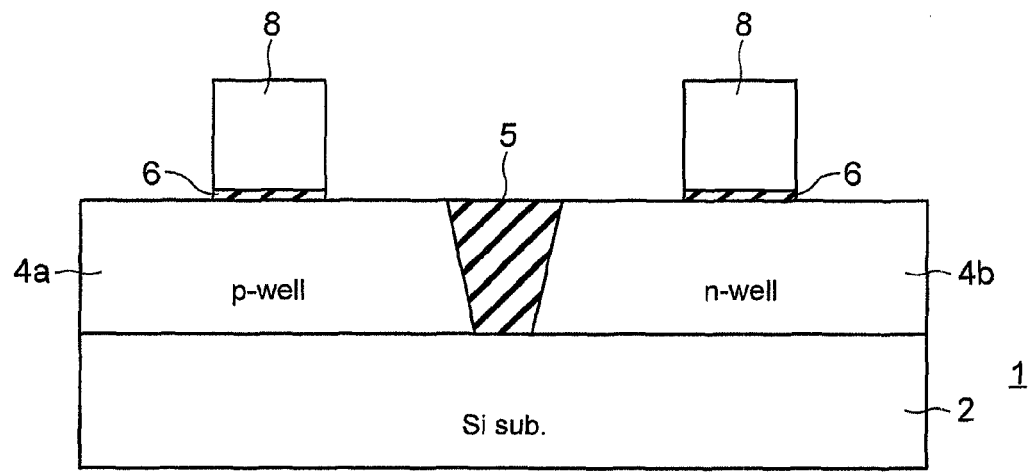
FIG. 3 is a cross-sectional view illustrating a method of manufacturing a semiconductor device according to the first embodiment.

As shown in FIG. 2, a gate insulating film 6 that is made of Si oxide and is approximately 1 nm in EOT (Effective Oxide Thickness) is formed on the semiconductor substrate 1, for example. The gate insulating film 6 can be made of high-k material including Si and O. As shown in FIG. 3, a polysilicon film 8 that is to be gate electrodes and is approximately 100 nm to 150 nm is deposited on the gate insulating film 6 by low pressure chemical vapor deposition (hereinafter also referred to as LPCVD). Patterning is then performed on the gate insulating film 6 and the polysilicon film 8 by an etching technique such as a lithography technique, a reactive ion etching (hereinafter also referred to as RIE), or the like, to form gate electrodes 8 each having a gate length of approximately 30 nm. If necessary, post-oxidation of 1 to 2 nm is performed. The post-oxidation is performed to form films that function as protection films for the later described source and drain regions.

Figure 4:
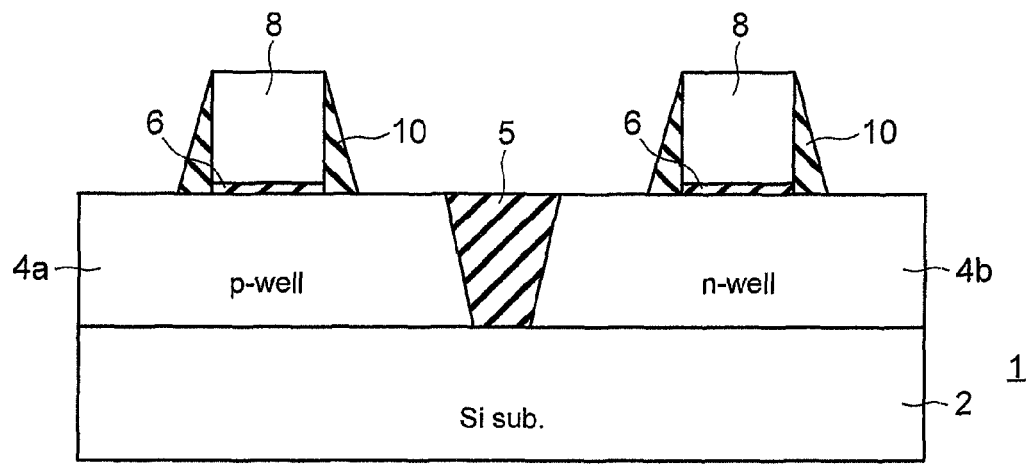
FIG. 4 is a cross-sectional view illustrating a method of manufacturing a semiconductor device according to the first embodiment.

A silicon nitride film of approximately 8 nm is then deposited by LPCVD, and etchback is performed by RIE, to leave the silicon nitride film only at the side portions of the gate electrodes 8. In this manner, gate sidewalls 10 made from the silicon nitride film are formed at the side portions of the gate electrodes 8, as shown in FIG. 4.

Figure 5:
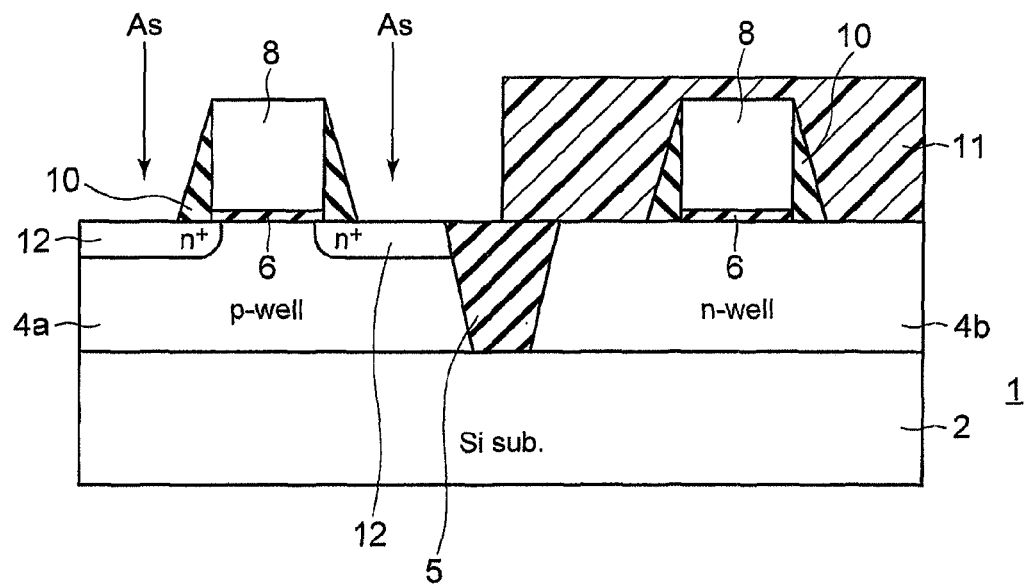
FIG. 5 is a cross-sectional view illustrating a method of manufacturing a semiconductor device according to the first embodiment.
Figure 6:
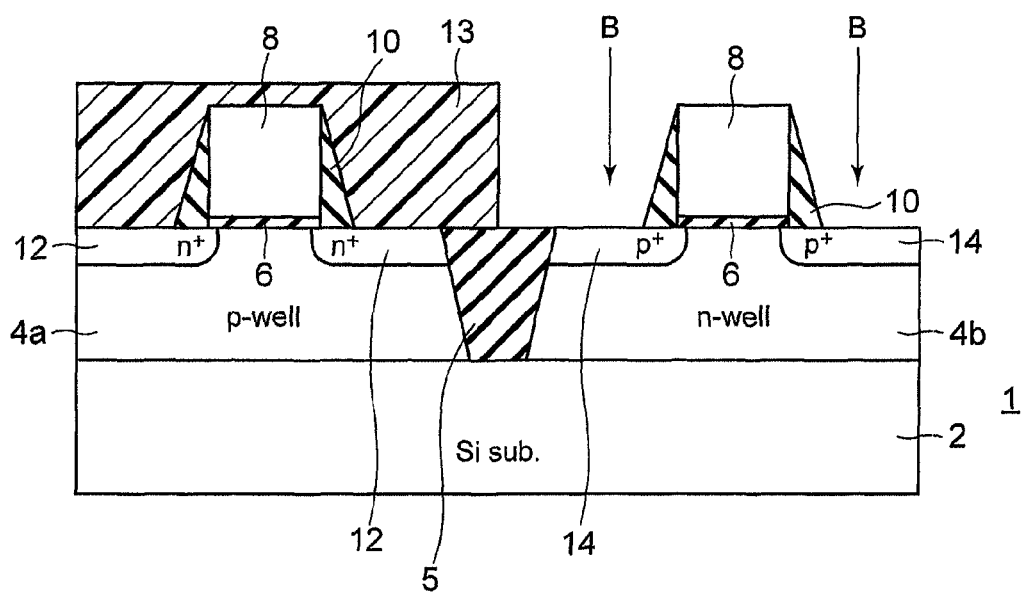
FIG. 6 is a cross-sectional view illustrating a method of manufacturing a semiconductor device according to the first embodiment.

As shown in FIG. 5, the n-well 4b is covered with a resist 11, and As ions are implanted into the p-well 4a, to form n-type source and drain regions 12 in the p-well 4a. After the resist 11 is removed, the p-well 4a is covered with a resist 13, and B ions are implanted into the n-well 4b, to form p-type source and drain regions 14 in the n-well 4b, as shown in FIG. 6. After the resist 13 is removed, annealing is performed at approximately 1000° C., to activate the impurities in the source and drain regions 12 and 14.

Figure 7:
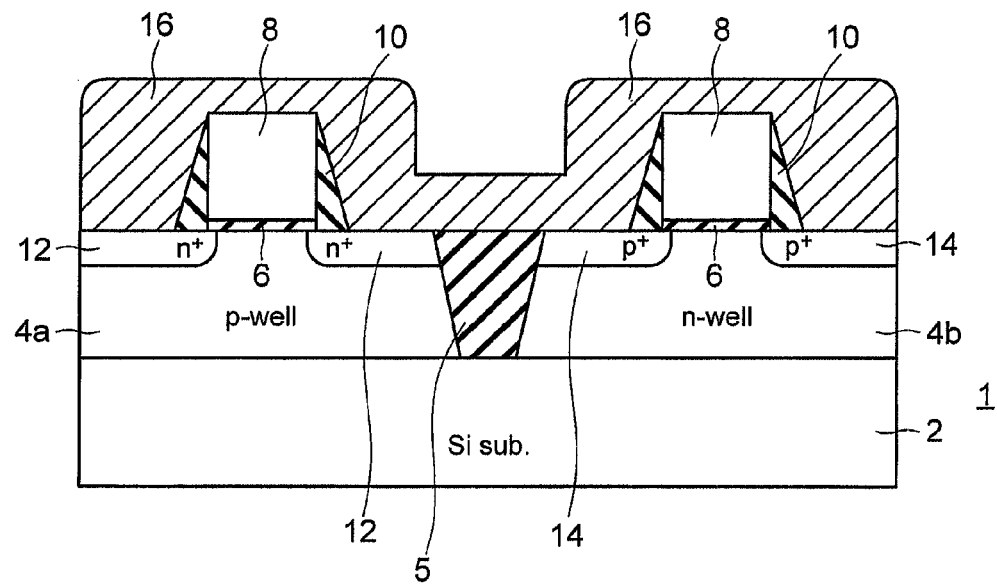
FIG. 7 is a cross-sectional view illustrating a method of manufacturing a semiconductor device according to the first embodiment.

As shown in FIG. 7, a $Co_2Mn$ (Co:Mn=2:1) film 16 of approximately 10 nm in thickness is then formed on the semiconductor substrate 1 by a sputtering technique, for example. That is, the $Co_2Mn$ film 16 is deposited so as to be in contact with the entire surface of the n-type MOSFET. The method of depositing the $Co_2Mn$ film 16 can be selected from the following methods: a method by which a target having the same composition as the $Co_2Mn$ film 16 is used; a method by which co-sputtering using a Co target and a Mn target is performed; and a method by which a Co film and a Mn film are stacked.

Figure 8:
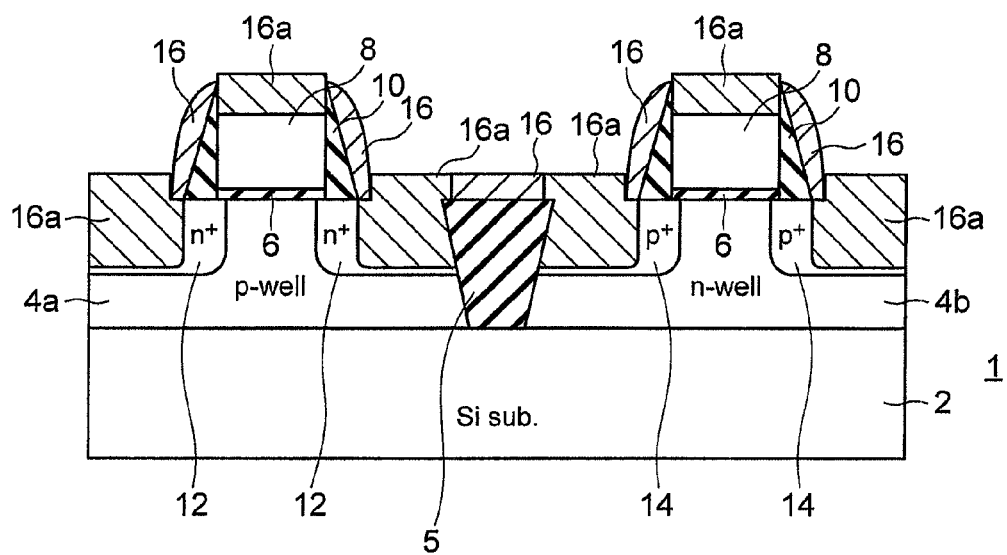
FIG. 8 is a cross-sectional view illustrating a method of manufacturing a semiconductor device according to the first embodiment.

After that, as shown in FIG. 8, 500° C. annealing is performed as a first heat treatment for approximately 30 seconds by RTA (Rapid Thermal Annealing), so that the $Co_2Mn$ film 16 reacts with the Si in the semiconductor substrate 1 and the polysilicon in the gate electrodes 8. In this manner, $Co_2MnSi$ (Co:Mn:Si=2:1:1) films 16a of approximately 20 nm in thickness are formed. The $Co_2MnSi$ films 16a are metal-rich magnetic silicide films, and are formed on the source drain regions 12 and 14, and on the gate electrodes 8. In this embodiment, the optimum temperature for the annealing is introduced by taking into account the crystallinity, the flatness of the surface and the interface, and impurity diffusion that were obtained as the results of annealing performed at 400° C. to 800° C. with a RTA apparatus. Although the optimum temperature depends on the $Co_2Mn$ film thickness and the Si film thickness, a temperature in the neighborhood of 500° C. is typically set as the optimum temperature. The $Co_2MnSi$ crystalline structure formed in the above manner is a polycrystalline structure, and is a mixed structure of a $L2_1$ structure and a B2 structure. In a case where $Co_2MnSi$ is used for spin MOSFET electrodes, a single-crystal $L2_1$ structure is ideal. However, in view of the spin polarization, spin MOSFET operations can be performed where there is a crystal order equal to or higher than that of a B2 structure. Due to the reaction between the $Co_2Mn$ film 16 and Si, the impurities (such as boron, arsenic, and phosphorus) contained in the source and drain regions 12 and 14 are pushed out toward the p-well 4a and the n-well 4b beforehand by a "snowplow" effect. As a result, the source and drain regions 12 and 14 spread toward the silicon substrate 2 (see FIGS. 7 and 8). The portions of the $Co_2Mn$ film 16 adhering to the device isolating region 5 and the gate sidewalls 10 are left unreacted. It should be noted that the first heat treatment can be performed through the following two stages: a 30-second treatment at 300° C., and a 30-second treatment at 500° C., for example. The conditions for obtaining high-quality $Co_2MnSi$ need to be optimized beforehand by the manufacturer, since those conditions depend on the environment of the annealing apparatus.

Figure 9:
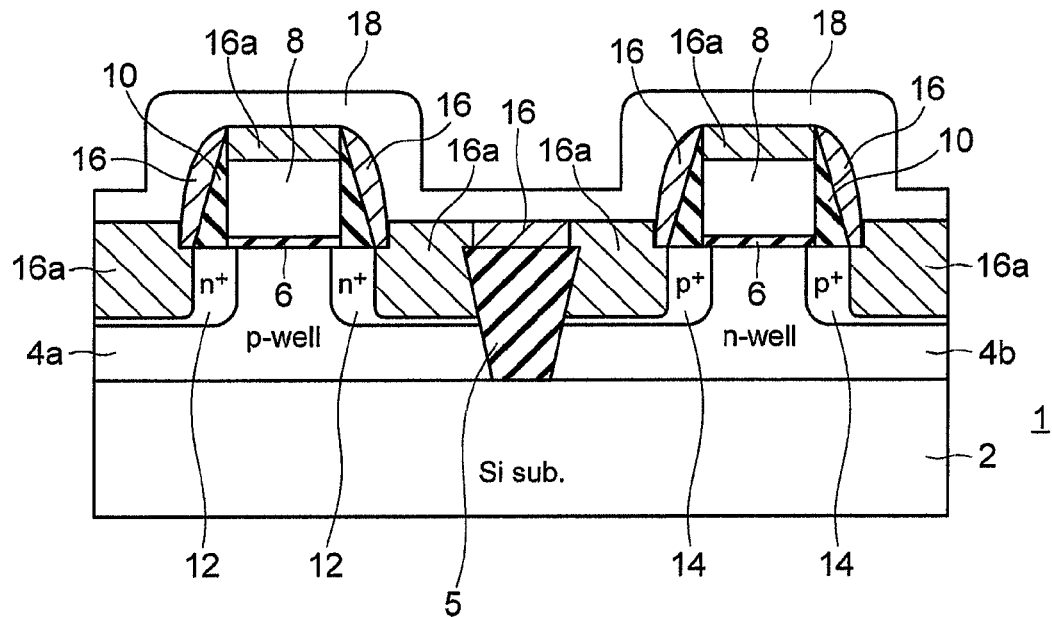
FIG. 9 is a cross-sectional view illustrating a method of manufacturing a semiconductor device according to the first embodiment.

A Si film 18 of 5 nm in thickness is then formed by a sputtering technique (FIG. 9). Although a sputtering technique is used in depositing the Si film 18 in this embodiment, some other conventional technique such as a vapor deposition technique or CVD can be used. However, the important point is the control over the film thickness of the Si film 18.

Figure 10:
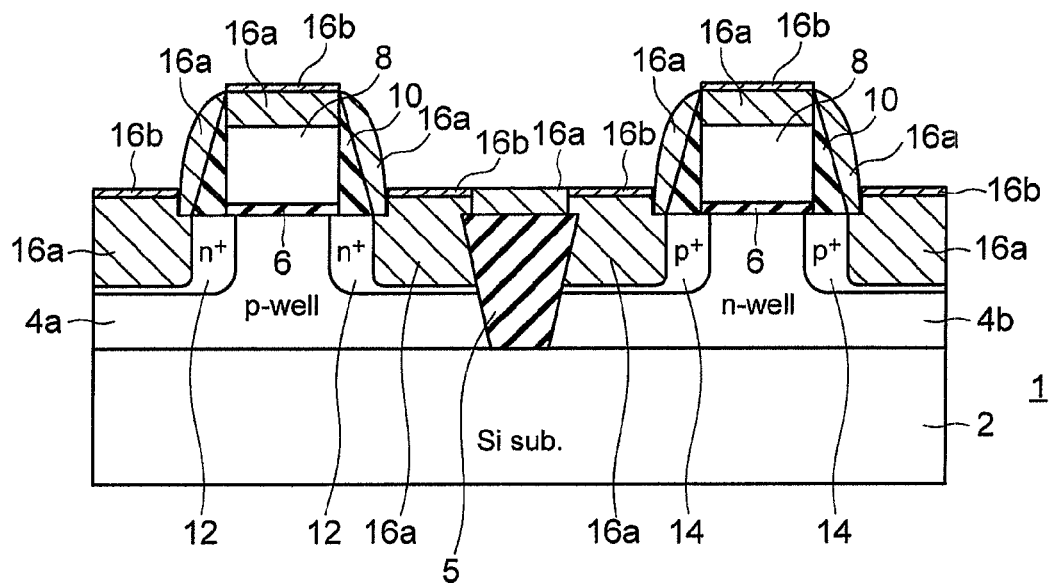
FIG. 10 is a cross-sectional view illustrating a method of manufacturing a semiconductor device according to the first embodiment.

As shown in FIG. 10, a second heat treatment is then performed, so that the surface layer of the metal-rich magnetic metal silicide film 16a reacts with the Si film 18, and is modified to have a Si-rich composition. The annealing is performed at 500° C. with a RTA apparatus. The conditions in this case also need to be optimized beforehand by the manufacturer, since those conditions depend on the environment of the annealing apparatus. For example, the $Co_2MnSi$ films 16a prior to the heat treatment reaction are turned into $(Co_2Mn)Si_2$ films 16b by the heat treatment reaction. In the $(Co_2Mn)Si_2$ films 16b, the composition ratio between $(Co_2Mn)$ and Si is 1:2, which is expressed as $(Co_2Mn):Si=1:2$. Accordingly, the $(Co_2Mn)Si_2$ films 16b are Si-rich silicide films. The portions of the $Co_2Mn$ film 16 adhering to the device isolating region 5 and the gate sidewalls 10 react with Si, and turn into the $Co_2MnSi$ films 16a. At this point, the portions of the silicide films 16a inside the p-well 4a and the n-well 4b slightly diffuse and spread in those wells toward the gate insulating film 6.

Figure 11:
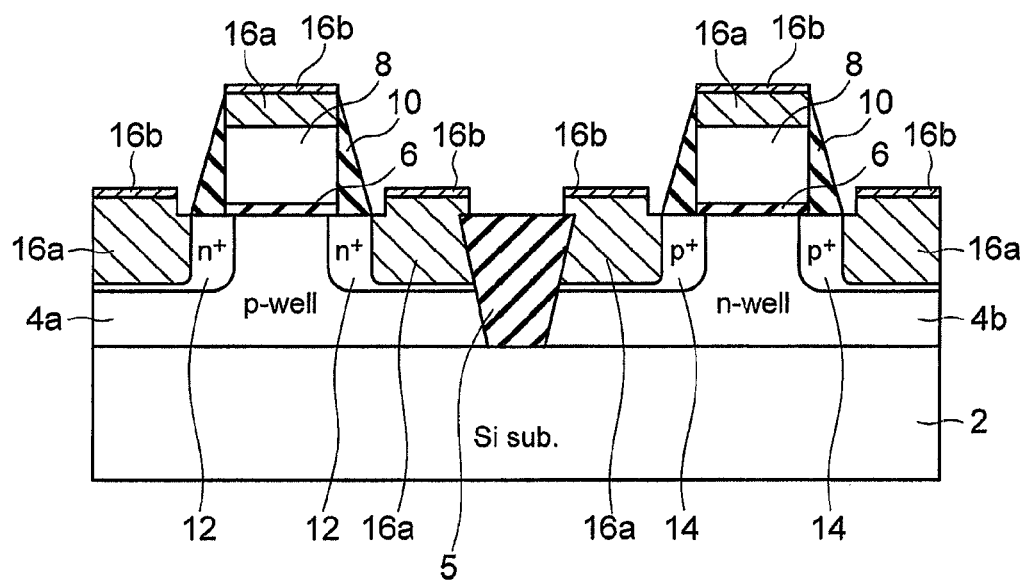
FIG. 11 is a cross-sectional view illustrating a method of manufacturing a semiconductor device according to the first embodiment.

An acid solution is then used to remove the $Co_2MnSi$ films 16a located on the device isolating region 5 and the gate sidewalls 10. As the acid solution, hydrofluoric acid, sulfuric acid, nitric acid, or the like is selected. The acid solution can be a conventional mixed solution, and can be the same as that used in an existing salicide process. The important point is the selectivity described in the following. In the etching procedure using the acid solution, the $Co_2MnSi$ films 16a as the metal-rich magnetic silicide films that are in contact with the source and drain regions, and are to be source and drain electrodes are not removed. This is because the Si-rich $(Co_2Mn)Si_2$ films 16b that are insoluble with acids are formed on the upper faces of those films, and the $(Co_2Mn)Si_2$ films 16b function as protection films. It should be noted that the $Co_2MnSi$ films 16a exist on the gate electrodes 8, and the $(Co_2Mn)Si_2$ films 16b exist on the $Co_2MnSi$ films 16a, as shown in FIG. 10. Through the above described procedures, the source and drain electrodes of spin MOSFETs are formed in a self-aligning manner with respect to the locations of the gate electrodes (FIG. 11).

In each spin MOSFET of this embodiment, the source and drain electrodes can be made to have different shapes (including a difference in film-plane area), so as to perform writing. That is, the source and drain electrodes are made to have different shapes, so that the magnetization direction of one of the source and drain electrodes is more easily reversed by spin-polarized electrons generated through application of a current than the magnetization direction of the other one of the electrodes. With this arrangement, one of the electrodes serves as a recording layer, and the other one of the electrodes serves as a reference layer, so that writing can be performed through spin-injection magnetization reversals. Also, as in the later described fifth embodiment, write units such as MTJ devices are provided on the source and drain electrodes, and writing can be performed by using the write units. In principle, it is of course possible to perform current-induced magnetic field writing on a spin MOSFET by applying currents to bit and word lines.

As described above, according to this embodiment, metal-rich magnetic metal silicide can be turned into the source and drain electrodes. Accordingly, spin MOSFETs that can prevent decreases in spin polarization as much as possible, and can have the source and drain electrodes formed in a self-aligning manner can be obtained.

In this embodiment, magnetic metal compounds containing Co as a principal component are used as the magnetic metal silicide films 16, 16a, and 16b. However, magnetic metal compounds containing Fe as a principal component can also be used. In this specification, a magnetic metal semiconductor compound containing a magnetic metal element (such as Co or Fe) as a principal component is a magnetic metal semiconductor compound in which the atomic proportion of a magnetic metal element (Co or Fe) is not smaller than those of the other components of the magnetic metal semiconductor compound.

In the above described first embodiment, the magnetic metal silicide is $Co_2MnSi$, which is a silicide of $Co_2Mn$ as a Heusler alloy. However, the present invention is not limited to that example, and any silicide that contains Co or Fe and is capable of achieving a high spin polarization of 60% or higher at room temperature can be selected as needed. Other than $Co_2MnSi$, $Co_2FeSi$, $Co_2Mn_{1-x}Fe_xSi$ (0<x<1), or the like can be used as a silicide of a Heusler alloy.

In a case where a Ge substrate, instead of a silicon substrate, is used, $Co_2MnGe$, which is a germanide, can be used as a magnetic metal compound. In a case where a SiGe substrate is used, $Co_2MnGe_{1-x}Si_x$ (0<x<1) or the like can be used as a magnetic metal compound.

In this specification, "Heusler alloys" (also called "full-Heusler alloys") is a collective term for intermetallic compounds each having a chemical composition expressed as $X_2YZ$. Here, X is a Co-, Fe-, Ni-, or Cu-based transition metal element or noble metal element on the periodic table. Y is a Mn-, V-, Cr-, or Ti-based transition metal element, and can have the same elemental species as X. Z is a representative element of groups III through V. The Heusler alloys $X_2YZ$ are classified into three kinds of crystalline structures, depending on the crystal order among X, Y, and Z. Structures that have the highest regularity and have the three elements distinguished as $X \neq Y \neq Z$ by an analysis such as X-ray diffraction utilizing the crystal periodicity are $L2_1$ structures. Structures that have the second highest regularity and have the three elements distinguished as $X \neq Y = Z$ are B2 structures. Structures in which the three elements cannot be distinguished and are expressed as $X = Y = Z$ are A2 structures. In this specification, Heusler alloys have $X_2YZ$ as principal components, and do not necessarily mean crystals with stoichiometric compositions. That is, Heusler alloys can contain materials that are not included in the $X_2YZ$ composition. Heusler alloys are ideally single-crystal structures, but can be polycrystalline structures or contain amorphous materials, as long as a spin polarization of 60% or higher is achieved in the entire film.

This is because the spin polarization of Fe, CoFe, or the like is approximately 50%, and therefore, more sophisticated spin MOSFETs cannot be realized unless a spin polarization equal to or higher than that is achieved.

Second Embodiment

Figure 12:
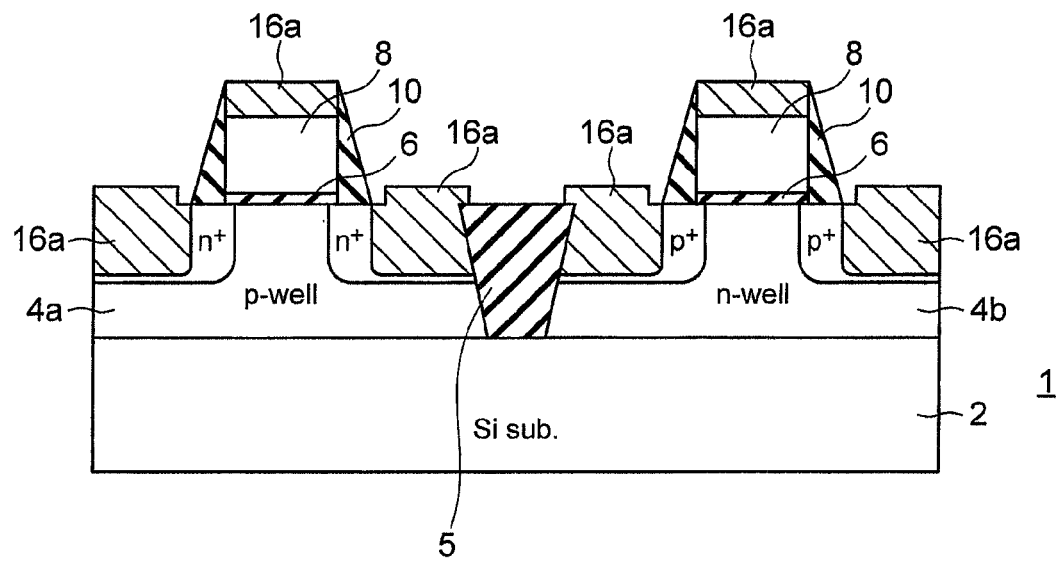
FIG. 12 is a cross-sectional view illustrating a method of manufacturing a semiconductor device according to a second embodiment.

Referring now to FIG. 12, a method of manufacturing a semiconductor device according to a second embodiment of is described. FIG. 12 is a cross-sectional view of spin MOS-FETs manufactured by the manufacturing method according to this embodiment. By the manufacturing method according to this embodiment, after the manufacturing procedure of the first embodiment illustrated in FIG. 11, the Si-rich silicide films 16b to be the source and drain electrodes are removed. At this point, the magnetic silicide films 16a that appear after the removal of the silicide films 16b and are to be the source and drain electrodes are located higher than the upper faces of the gate insulating films 6. The silicide films 16b on the gate electrodes 8 are also removed, and the metal-rich magnetic silicide films 16a remain.

Ar ion milling is used to remove the Si-rich silicide. This is because anisotropic etching is performed by Ar ions. Anisotropic etching can also be performed by causing substrate-bias RF discharge only with an Ar gas by a RIE apparatus, instead of the Ar ion milling. By removing the upper-layer Si-rich silicide films 16b as in this embodiment, MTJs (Magnetic Tunnel Junctions) described later in the fifth embodiment can be provided, and writable spin MOSFETs can be formed. In a case where MTJs are formed without removal of the Si-rich silicide films 16b, the Si-rich silicide films 16b are nonmagnetic, and therefore, a magnetoresistance effect cannot be achieved.

Like the first embodiment, this embodiment can provide spin MOSFETs that can prevent decreases in spin polarization as much as possible, and can have the source and drain electrodes formed in a self-aligning manner.

Third Embodiment

Figure 13:
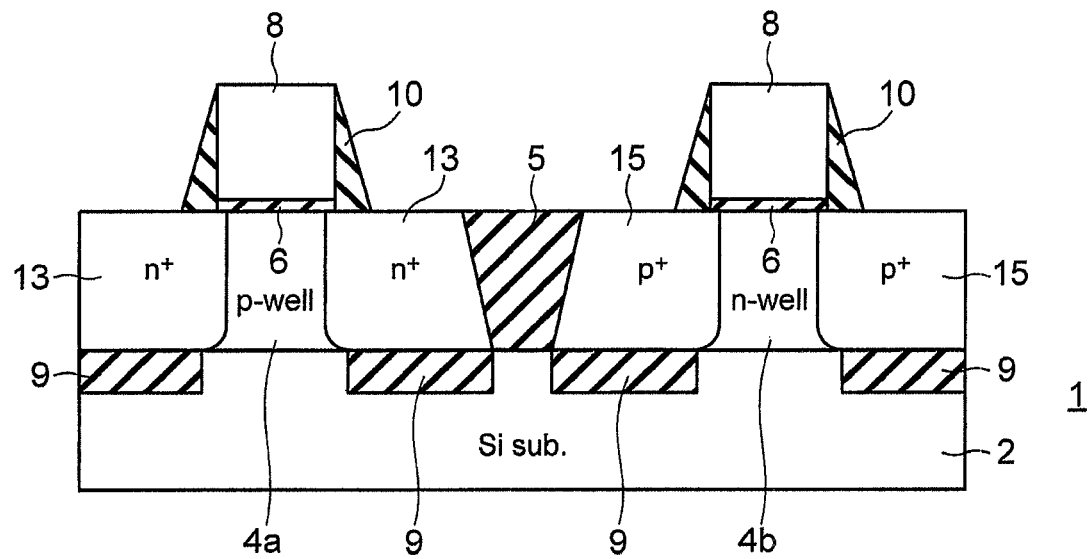
FIG. 13 is a cross-sectional view illustrating a method of manufacturing a semiconductor device according to a third embodiment.
Figure 14:
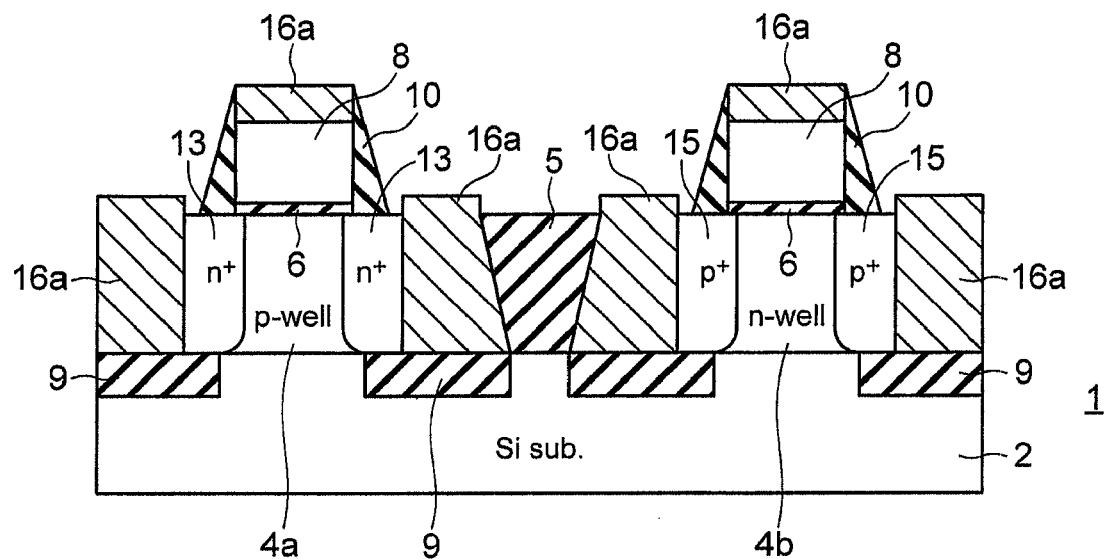
FIG. 14 is a cross-sectional view illustrating a method of manufacturing a semiconductor device according to the third embodiment.

Referring now to FIGS. 13 and 14, a method of manufacturing a semiconductor device according to a third embodiment is described.

The manufacturing method according to this embodiment is a method by which the composition of a magnetic silicide is adjusted by using buried insulating layers. The procedures carried out prior to the formation of the gate electrodes 8 illustrated in FIG. 3 are the same as those of the first embodiment. At this point, a mask for forming a gate electrode exists on each of the gate electrodes 8. With the use of this mask, self-aligning etching is performed on Si regions to be the source and drain regions in the p-well 4a and the n-well 4b. After the etching, insulating layers 9 are buried, and the Si layers to be the source and drain regions are formed on the insulating layers 9. The Si layers are not necessarily single-crystal layers, but can be polycrystalline or amorphous layers. The p-well 4a and the n-well 4b under the gate insulating films 6 are made of single-crystal materials doped with impurities. After that, the same procedures as those described in the first embodiment are carried out, and the gate sidewalls 10 are formed at the side portions of the gate electrodes 8. With the gate electrodes 8 and the gate sidewalls 10 being used as masks, n-type impurity ions (such as As ions) are implanted into the p-well 4a, and p-type impurity ions (such as B ions) are implanted into the n-well 4b. Activation annealing is then performed to form n-type source and drain regions 13 in the p-well 4a, and p-type source and drain regions 15 in the n-well 4b (FIG. 13).

By carrying out the same procedures as those described in the first embodiment, the source and drain regions 13 and 15 are silicided, and the magnetic metal silicide films 16a are formed (FIG. 14). At this point, the magnetic metal silicide films 16a are also formed on the gate electrodes 8. By using the manufacturing method according to this embodiment, a reaction occurs and continues until the silicide is brought into contact with the buried insulating layers 9. The reaction then stops, and therefore, controlling the ratio between the metal and the Si in the magnetic metal silicide films 16a becomes easier. It should be noted that not only $SiO_2$ or $Si_3N_4$ but also any material with insulating properties can be used as the buried insulating layers 9.

In this embodiment, the buried insulating layers 9 are formed in the bulk silicon substrate 2. Therefore, the volume between the substrate and each device becomes smaller than that in a case where buried insulating layers are not formed. Accordingly, high-speed operations can be performed. Also, a SOI substrate is not used, but a bulk substrate is used. Accordingly, the manufacturing costs can be lowered.

In this embodiment, magnetic metal silicide can be turned into source and drain electrodes. Accordingly, spin MOSFETs that can prevent decreases in spin polarization as much as possible, and can have the source and drain electrodes formed in a self-aligning manner can be obtained.

Fourth Embodiment

Figure 15:
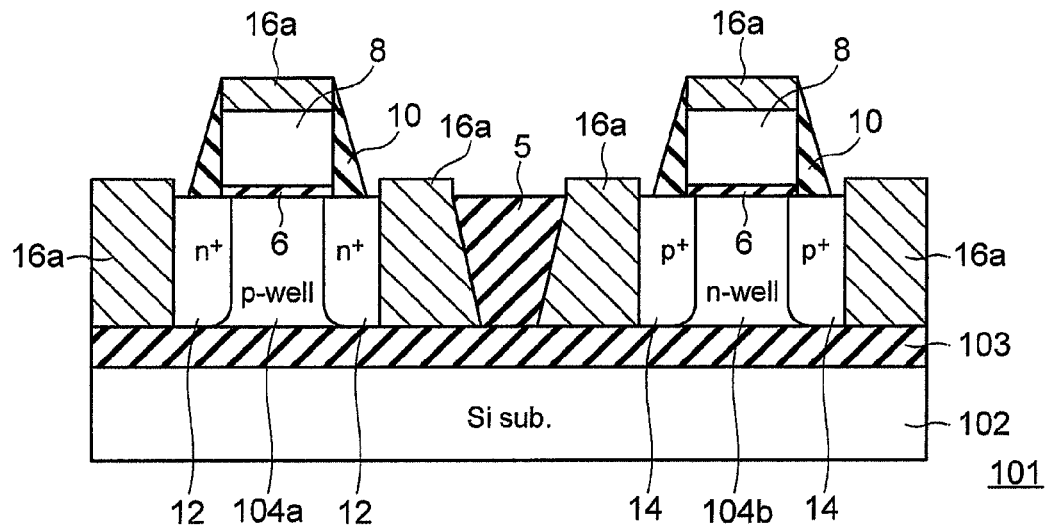
FIG. 15 is a cross-sectional view illustrating a method of manufacturing a semiconductor device according to a fourth embodiment.

Referring now to FIG. 15, a method of manufacturing a semiconductor device according to a fourth embodiment of is described. The manufacturing method according to this embodiment is the same as that according to the first embodiment, except that spin MOSFETs are formed by using a SOI (Silicon-On-Insulator) substrate 101 including a supporting substrate 102 made of silicon, a buried insulating layer 103, and a SOI layer, instead of the bulk substrate 1. The SOI layer is divided into a p-well 104a and an n-well 104b by a device isolating region 105 made of an insulating film.

By carrying out the same procedures as those of the first embodiment, the source and drain regions 12 and 14 are silicided on the SOI substrate 101, and the magnetic metal silicide films 16a are formed (FIG. 15). At this point, the magnetic metal silicide films 16a are also formed on the gate electrodes 8. By using the manufacturing method according to this embodiment, a reaction occurs and continues until the silicide is brought into contact with the buried insulating layer 103. The reaction then stops, and therefore, controlling the ratio between the metal and the Si in the magnetic metal silicide films 16a becomes easier. It should be noted that not only $SiO_2$ or $Si_3N_4$ but also any material with insulating properties can be used as the buried insulating layer 103.

In this embodiment, magnetic metal silicide can be turned into source and drain electrodes. Accordingly, spin MOSFETs that can prevent decreases in spin polarization as much as possible, and can have the source and drain electrodes formed in a self-aligning manner can be obtained. Since the process to bury insulating films as in the third embodiment is not required, the number of procedures can be reduced.

Also, since a SOI substrate is used, the volume between the substrate and each device becomes smaller, and high-speed operations can be performed.

Although a SOI substrate is used in this embodiment, spin MOSFETs can be formed by using a GOI (Germanium-On-Insulator) substrate.

Fifth Embodiment

Figure 16:
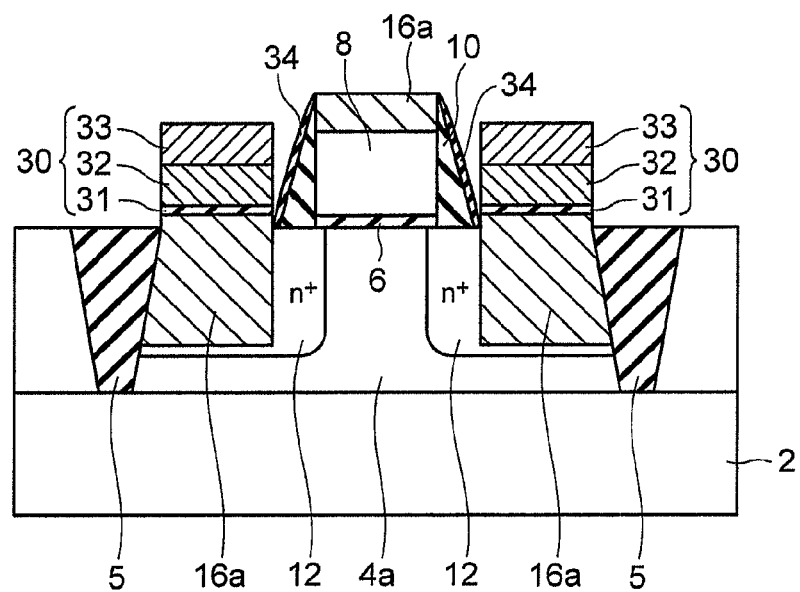
FIG. 16 is a cross-sectional view illustrating a method of manufacturing a semiconductor device according to a fifth embodiment.

Referring now to FIG. 16, a method of manufacturing a spin MOSFET according to a fifth embodiment is described. In the first through fourth embodiments, writing can be performed by using the difference in shape between the source and drain electrodes. In the fifth embodiment, write units 30 each including a MTJ (Magnetic Tunnel Junction) device or a GMR (Giant Magneto Resistive) device having magnetic metal silicide as a one-sided electrode are provided on the magnetic metal silicide films 16a located on the source and drain regions. The write units 30 also serve as source and drain electrodes.

For ease of explanation, a method of manufacturing only an n-channel spin MOSFET among CMOSFETs is described below. If the conductivity types are the opposites of those in an n-channel spin MOSFET, a p-channel spin MOSFET can also be formed in the manner described below.

First, an n-channel spin MOSFET manufactured by the manufacturing method according to the first embodiment is prepared. In each spin MOSFET manufactured according to the first embodiment, the Si-rich magnetic metal silicide films 16b are formed on the surfaces of the magnetic metal silicide films 16a, as shown in FIG. 11. However, the Si-rich magnetic metal silicide films 16b are removed by using ion milling, as in the second embodiment. After that, a MgO layer 31, a CoFe layer 32 having a pinned magnetization direction, an IrMn layer 33 that pins the magnetization direction of the CoFe layer 32, and a protection layer made of Ru are deposited as a film stack on each of the magnetic metal silicide films 16a. The ion milling procedure and the film stack forming procedure are desirably carried out in vacuum by the same apparatus. It should be noted that the magnetic layers constituting the film stacks also adhere to the gate sidewalls 10, but the film thicknesses of the adhering magnetic layers are smaller than the film thicknesses of the magnetic layers of the film stacks formed above the source and drain regions.

After that, a process to oxidize the surfaces of the film stacks on the semiconductor substrate with $O_2$ plasma is performed by an $O_2$ asher device. This is called a sidewall oxidation process. By using this process, the magnetic layers adhering to the gate sidewalls 10 are completely oxidized, to form insulating magnetic oxide layers 34. Although $O_2$ is mainly used for the oxidation of the magnetic layers, an $O_2$ gas mixed with some other gas can be used, depending on the types of the layers in the film stacks. At this point, the protection films made of Ru are sublimed by the $O_2$ plasma. The magnetic layers adhering to the gate sidewalls 10 have smaller film thicknesses than those in the film stacks located above the source and drain regions, and accordingly, are easily oxidized. After that, patterning is performed on the film stacks, to perform isolation from the source electrode and the drain electrode, and isolation from adjacent devices (such as spin MOSFETs). As a result of this, the stacked structures 30 each including the MgO layer 31, the CoFe layer 32, and the IrMn layer 33 are formed on the magnetic metal silicide films 16a in the source and drain regions, and the magnetic oxide layers 34 containing the same elements as those of the magnetic layers in the stacked structures are formed on the surfaces of the gate sidewalls 10 (FIG. 16). In this manner, the gate is electrically insulated from the source and drain by the magnetic oxide layers 34 and the gate sidewalls 10.

In this embodiment, MTJ devices are used as the write units 30. However, GMR devices each having a stacked structure in which a Cu layer (a nonmagnetic spacer), a CoFe layer, an IrMn layer, and a Ru layer are stacked in this order can be used. In that case, the nonmagnetic spacer is not limited to Cu, but an element selected from the group consisting of Ag, V, Cr, Au, and the like can be used as the nonmagnetic spacer. Also, a nonmagnetic Heusler alloy can be selected as the nonmagnetic spacer.

Spin MOSFETs manufactured by the manufacturing method according to this embodiment have the great advantages that the number of interconnects can be made smaller than that required by a conventional current-induced magnetic-field writing method, and writing can be performed with a low current.

Although a spin MOSFET is formed on a bulk substrate in the above described fifth embodiment, the spin MOSFET can also be formed on a SOI substrate or a GOI substrate.

Sixth Embodiment

Referring now to FIGS. 17 through 20, a method of manufacturing a spin MOSFET according to a sixth embodiment of is described. By the manufacturing method according to this embodiment, electric conduction between the gate electrode 8 and the source and drain electrodes 30 is completely cut off. Therefore, an etchback process is performed after the formation of the film stacks to be the write units 30 of the fifth embodiment. In view of this, the film thickness of the gate electrode 8 is 50 nm to 100 nm, which is greater than normal.

Figure 17:
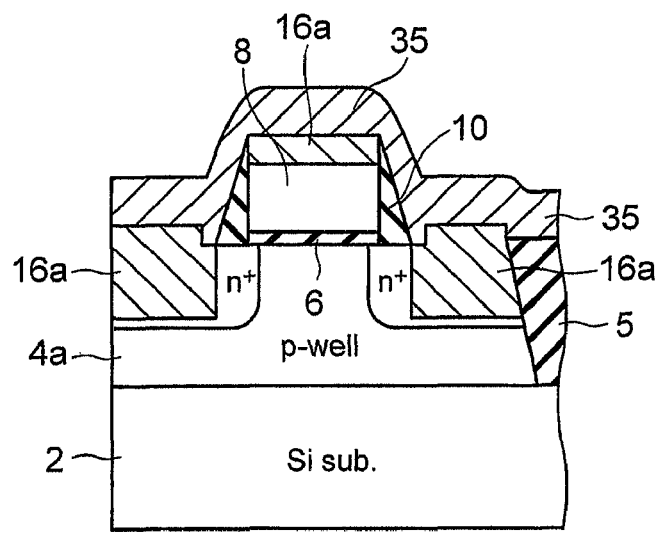
FIG. 17 is a cross-sectional view illustrating a method of manufacturing a semiconductor device according to a sixth embodiment.
Figure 18:
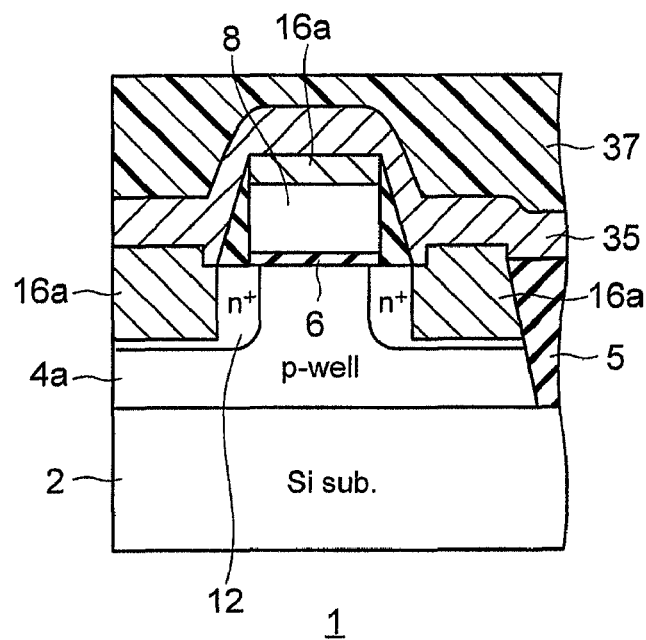
FIG. 18 is a cross-sectional view illustrating a method of manufacturing a semiconductor device according to the sixth embodiment.
Figure 19:
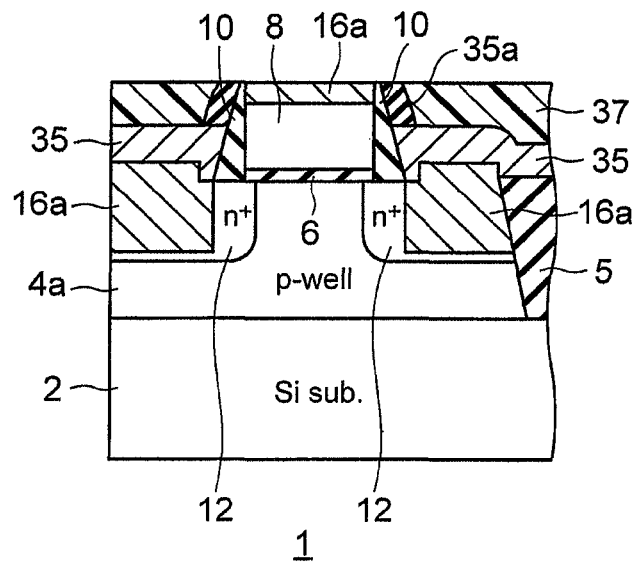
FIG. 19 is a cross-sectional view illustrating a method of manufacturing a semiconductor device according to the sixth embodiment.
Figure 20:
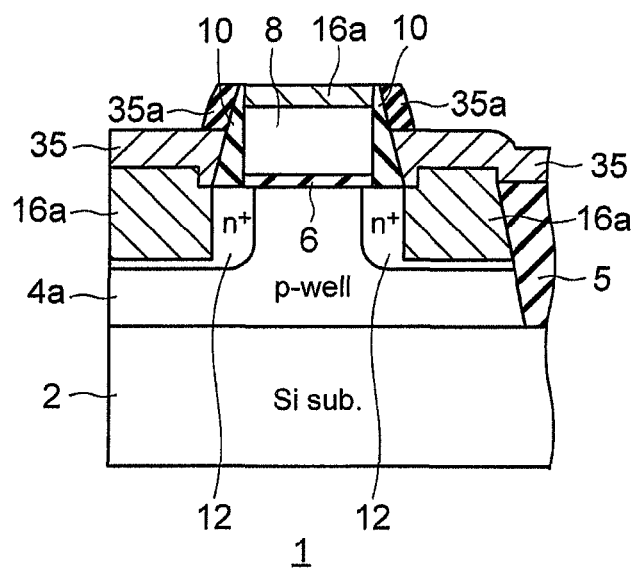
FIG. 20 is a cross-sectional view illustrating a method of manufacturing a semiconductor device according to the sixth embodiment.

Referring to the drawings, the etchback process is described. FIG. 17 shows a situation where a magnetic film 35 (equivalent to the film stacks 30 of the fifth embodiment, for example) is formed on the entire substrate. In this situation, there is electrical short-circuiting between the gate and the source and drain. Therefore, the following etchback process is performed. First, as shown in FIG. 18, a resist 37 is applied onto the entire surface. The resist 37 is applied and is then baked, so that the concavities and convexities of the substrate 1 are flattened. For example, the substrate 1 is spin-coated with a conventional photoresist at 5000 rpm, and baking is performed at approximately 175° C. by using a hot plate. After that, RIE is performed on the entire surface of the substrate 1, as shown in FIG. 19. As for the RIE gases, an $O_2$ gas is mainly used as the etching gas until the upper face of the magnetic film 35 appears or is exposed through the resist surface, and a gas such as an Ar gas that can be used for isotropic etching is used after the upper face of the magnetic film 35 is exposed. As a result of this, the portion of the magnetic film 35 located on the gate electrode 8 and the upper portions of the magnetic film 35 adhering to the gate sidewalls 10 are removed by the etching (FIG. 19). All the resist might be removed by this RIE. If the resist remains, the remaining resist is removed by $O_2$ asher or the like. As a result of this, the portions of the magnetic film 35 adhering to the upper portions of the gate sidewalls 10 are oxidized and are turned into insulating films 35a, and the gate 8 is electrically insulated from the portions of the magnetic film 35 located on the source and drain. After that, patterning is performed on the magnetic film 35, to separate the subject device from adjacent devices (such as spin MOSFETs). In this situation, however, considerable capacitance is generated between the gate and the source and drain, and might become a hindrance to high-speed operations of the device. In such a case, selective etching or patterning needs to be performed on the insulating films 35a. The etchback process of this embodiment and the process to oxidize the films adhering to the gate sidewalls with $O_2$ plasma as described in the fifth embodiment can be combined where necessary.

Although a spin MOSFET is formed on a bulk substrate in the above described sixth embodiment, the spin MOSFET can also be formed on a SOI substrate or a GOI substrate.

Seventh Embodiment

Figure 21:
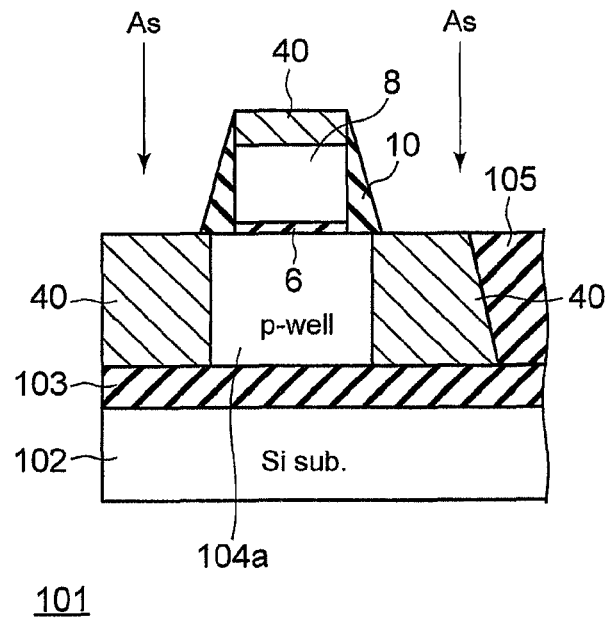
FIG. 21 is a cross-sectional view illustrating a method of manufacturing a semiconductor device according to a seventh embodiment.
Figure 22:
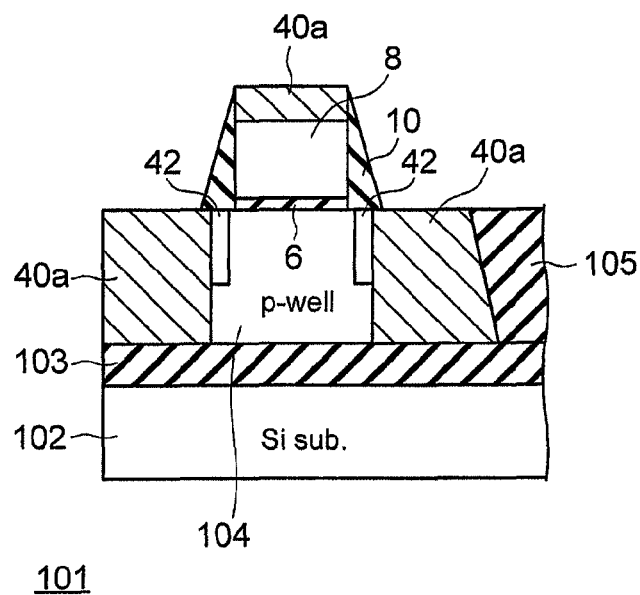
FIG. 22 is a cross-sectional view illustrating a method of manufacturing a semiconductor device according to the seventh embodiment.

Next, a method of manufacturing a spin MOSFET according to a seventh embodiment is described. In the above described first through sixth embodiments, a silicide film is formed after the impurity layers to be the source and drain regions are formed. By the manufacturing method according to this embodiment, a silicide film is formed prior to the formation of the impurity layers after the gate formation. After the silicide formation, an ion implantation is performed (late ion implantation). For example, as shown in FIG. 21, after the gate insulating film 6, the gate electrode 8, and the gate sidewalls 10 are formed on the p-well 104a of the SOI substrate 101, a magnetic metal silicide film (such as a $Co_2MnSi$ film) 40 is formed on the source and drain regions by using the same procedures as those of the first embodiment. Reference numeral 105 represents a device isolation region. After that, n-type impurity ions (such as As ions) are implanted into the magnetic metal silicide film 40. The magnetic metal silicide film 40 turns into a magnetic metal silicide film 40a including n-type impurity ions as shown in FIG. 22. As a result, sharp and high-concentration impurity layers 42 are formed at the interfaces between the magnetic metal silicide film 40 and Si. silicide film 40a and Si. By the late ion implantation, activated impurity layers are formed at the interfaces between the silicide and Si at a relatively low temperature of approximately 500° C. In this case, very shallow impurity layers can be formed, and accordingly, the short channel effect of the spin MOSFET is advantageously restricted if the silicide is formed as a relatively thinner film. Since activated impurity layers are formed at a relatively low temperature of approximately 500° C., high-temperature annealing for activation becomes unnecessary. As a result of this, a stacked structure formed by stacking a high-k material and a metal gate can be used as the gate structure, and accordingly, a more sophisticated spin MOSFET can be manufactured.

Although a spin MOSFET is formed on a SOI substrate in the above described seventh embodiment, the spin MOSFET can also be formed on a bulk substrate or a GOI substrate.

Eighth Embodiment

Figure 23:
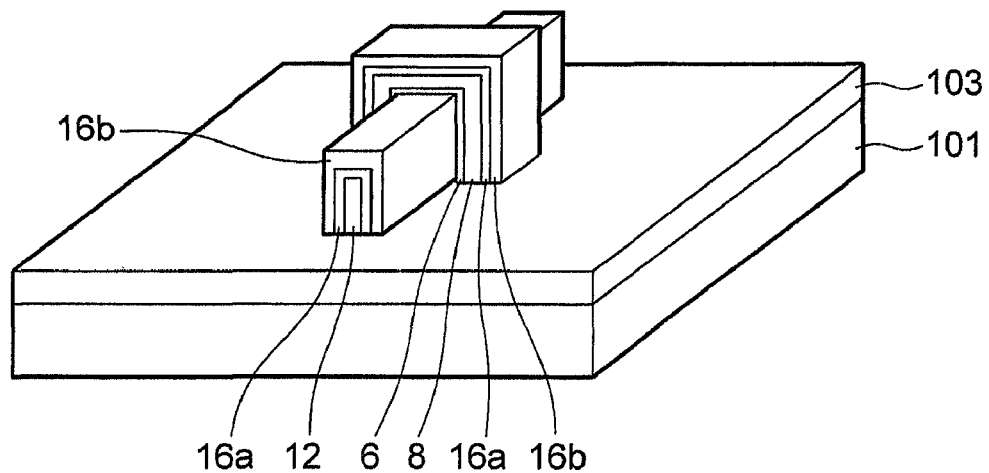
FIG. 23 is a cross-sectional view illustrating a method of manufacturing a semiconductor device according to an eighth embodiment.

Referring now to FIG. 23, a method of manufacturing a spin MOSFET according to an eighth embodiment of is described.

A spin MOSFET manufactured by the manufacturing method according to this embodiment is a fin-type spin MOSFET. First, a SOI substrate including the silicon supporting substrate 101, the buried insulating layer 103, and a SOI layer (such as a p-type SOI layer) is prepared, and the SOI layer is processed into a "fin" shape (a parallelepiped or a thin and long cylindrical shape). By applying the conventional procedures for manufacturing a Fin-MOSFET to the fin-type semiconductor layer, the gate insulating film 6 is formed on the pair of side faces along the longitudinal direction of the "fin" or on those side faces and the upper face of the "fin." The gate electrode 8 made of polysilicon, for example, is then formed to cover the gate insulating film 6. After that, impurity ions (such as n-type impurity ions) are implanted into the portions of the semiconductor layer located on both sides of the gate electrode 8, to form the source and drain regions 12. After that, by using the procedures described in the first embodiment, the metal-rich silicide films 16a are formed on the source and drain regions 12. The Si-rich silicide films 16b are then formed, to complete the fin-type spin MOSFET (FIG. 23).

The fin-type spin MOSFET formed in the above manner can maintain the gate driving force even in a case where the gate length is as small as approximately 10 nm. Accordingly, high-performance LSIs can be manufactured.

In this embodiment, magnetic metal silicide can also be turned into source and drain electrodes. Accordingly, a spin MOSFET that can prevent decreases in spin polarization as much as possible, and can have the source and drain electrodes formed in a self-aligning manner can be obtained.

Ninth Embodiment

Next, a method of manufacturing a spin MOSFET according to a ninth embodiment is described.

By the manufacturing method according to this embodiment, the manufacturing process of the first embodiment shifts to the procedure of $O_2$ plasma oxidation described in the fifth embodiment. That is, the method according to this embodiment is a method of reforming magnetic metal layers adhering to the sidewalls of each gate electrode into insulating films.

Figure 24:
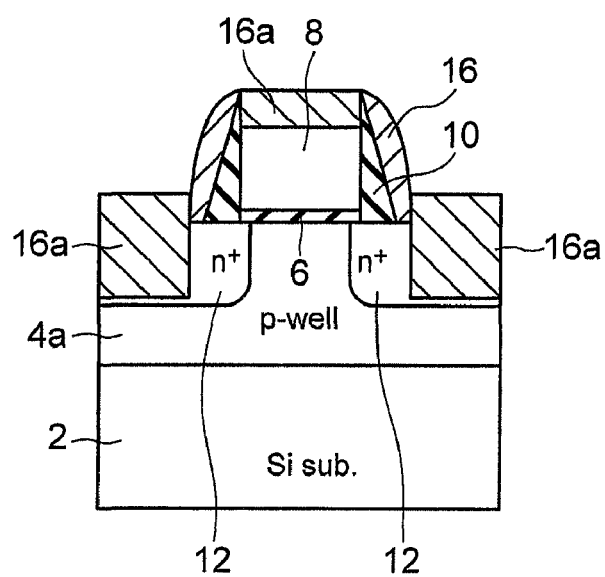
FIG. 24 is a cross-sectional view illustrating a method of manufacturing a semiconductor device according to a ninth embodiment.

FIG. 24 is a cross-sectional view of an n-channel spin MOSFET at the point where the procedure of the first embodiment illustrated in FIG. 8 is finished.

Figure 25:
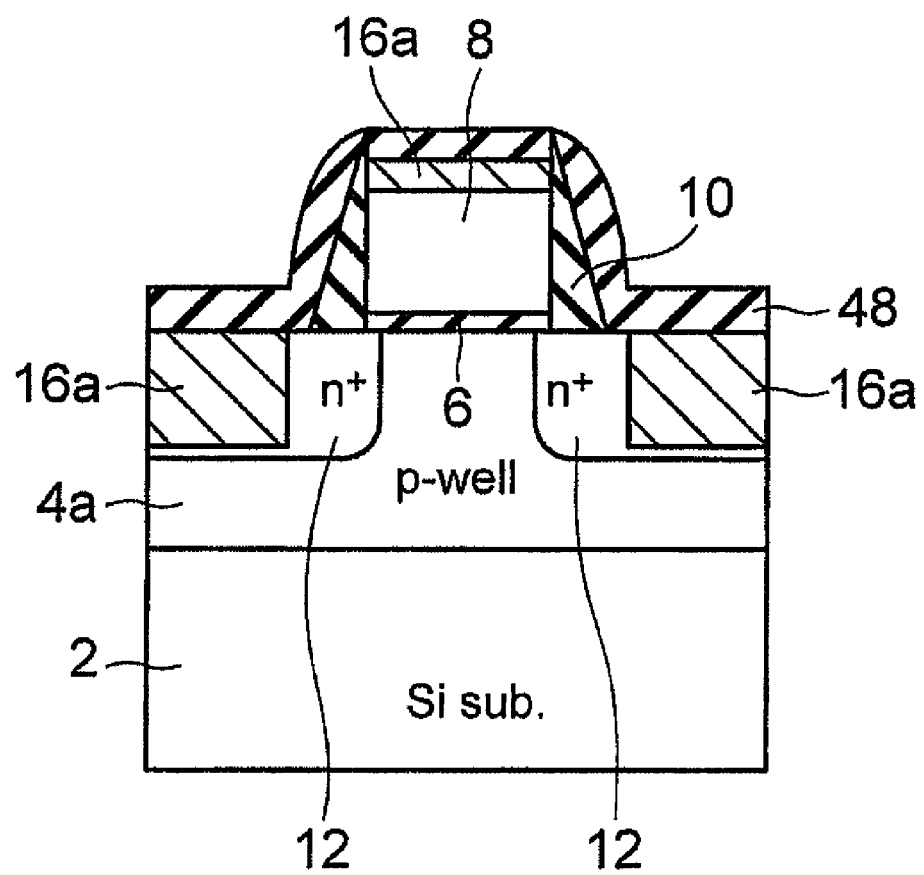
FIG. 25 is a cross-sectional view illustrating a method of manufacturing a semiconductor device according to the ninth embodiment.

In this embodiment, the magnetic silicide films 16a are not necessarily made of complete silicide. An entire surface oxidation process with $O_2$ plasma is performed on the entire surface of the substrate, to form a magnetic oxide layer 48 on the surface, as shown in FIG. 25. The $O_2$ plasma oxidation is performed so that thorough insulation is formed between the gate and the source and drain. After that, the selective wet etching described in the first embodiment is performed to remove the magnetic oxide layer 48 and complete the spin MOSFET.

In a case where a LSI using spin MOSFETs has a circuit structure in which devices adjacent to each spin MOSFET are regular MOSFETs, spin MOSFETs can be formed in a self-aligning manner only through the oxidation process with $O_2$ plasma according to this embodiment.

In this embodiment, magnetic metal silicide can also be turned into source and drain electrodes. Accordingly, a spin MOSFET that can prevent decreases in spin polarization as much as possible, and can have the source and drain electrodes formed in a self-aligning manner can be obtained.

Although a spin MOSFET is formed on a bulk substrate in the above described ninth embodiment, the spin MOSFET can also be formed on a SOI substrate or a GOI substrate.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a gate insulating film on a first semiconductor layer in a substrate;
    forming a gate electrode on the gate insulating film;
    forming a gate sidewall at a side portion of the gate electrode, the gate sidewall being made of an insulating material;
    forming a magnetic metal film on regions to be source and drain regions in the first semiconductor layer and on the gate sidewall;
    performing a first heat treatment to turn the magnetic metal film on the regions in the first semiconductor layer into a first magnetic metal semiconductor compound film and leave the magnetic metal film on the gate sidewall, the first magnetic metal semiconductor compound film containing a magnetic metal element of the magnetic metal film;
    forming a semiconductor film on the first magnetic metal semiconductor compound film and on the magnetic film on the gate sidewall after the formation of the first magnetic metal semiconductor compound film, the semiconductor film including the same semiconductor as a semiconductor of the first semiconductor layer;
    performing a second heat treatment to turn a surface part of the first magnetic metal semiconductor compound film into a second magnetic metal semiconductor compound film, and turn the magnetic metal film on the gate sidewall into a third magnetic metal semiconductor compound film, the semiconductor in the second magnetic metal semiconductor compound film having a higher concentration than a concentration of the semiconductor in the first magnetic metal semiconductor compound film, the semiconductor in the third magnetic metal semiconductor compound film having a lower concentration than the concentration of the semiconductor in the second magnetic metal semiconductor compound film; and
    removing the third magnetic metal semiconductor compound film on the gate sidewall.

2. The method according to claim 1, further comprising forming the source and drain regions by introducing an impurity into the regions in the first semiconductor layer, the impurity being of the opposite conductivity type of a conductivity type of the first semiconductor layer.

3. The method according to claim 1, wherein the substrate includes a supporting substrate and a buried insulating layer formed on the supporting substrate, and the first semiconductor layer is formed on the buried insulating layer.

4. The method according to claim 3, wherein the first magnetic metal semiconductor compound film formed on the regions to be the source and drain regions is in contact with the buried insulating layer.

5. The method according to claim 1, further comprising:
    removing the second magnetic metal semiconductor compound film on the first magnetic metal semiconductor compound film; and
    forming a film stack over the first magnetic metal semiconductor compound film, the gate sidewall, and the gate electrode, the film stack including a magnetic layer.

6. The method according to claim 5, further comprising oxidizing a portion of the film stack after the formation of the film stack, the portion of the film stack being located over the gate sidewall.

7. The method according to claim 5, further comprising:
    forming a resist layer over the film stack after the formation of the film stack, and flattening an upper face of the resist layer;
    removing the resist layer to expose a first portion of the film stack located over the gate electrode and a part of a second portion of the film stack located over the gate sidewall;
    removing the first portion of the film stack and the part of the second portion of the film stack; and
    oxidizing a remaining part of the second portion of the film stack located over the gate sidewall.

8. The method according to claim 1, wherein the first semiconductor layer is formed on an insulating film and has a Fin type shape.

9. A method of manufacturing a semiconductor device, comprising:
    forming a gate insulating film on a first semiconductor layer in a substrate;
    forming a gate electrode on the gate insulating film;
    forming a gate sidewall at a side portion of the gate electrode, the gate sidewall being made of an insulating material;
    removing portions of the first semiconductor layer, the portions being regions to be source and drain regions;
    forming an insulating layer on each bottom of respective portions in which the first semiconductor layer have been removed;
    forming a second semiconductor layer on the insulating layer, the second semiconductor layer including the same semiconductor as a semiconductor of the first semiconductor layer;
    forming a magnetic metal film on the second semiconductor layer and the gate sidewall;
    performing a first heat treatment to turn the magnetic metal film on the second semiconductor layer into a first magnetic metal semiconductor compound film and leave the magnetic metal film on the gate sidewall, the first magnetic metal semiconductor compound film containing a magnetic metal element of the magnetic metal film;
    forming a semiconductor film on the first magnetic metal semiconductor compound film and on the magnetic film on the gate sidewall after the formation of the first magnetic metal semiconductor compound film, the semiconductor film including the same semiconductor as a semiconductor of the second semiconductor layer;
    performing a second heat treatment to turn a surface part of the first magnetic metal semiconductor compound film into a second magnetic metal semiconductor compound film, and turn the magnetic metal film on the gate sidewall into a third magnetic metal semiconductor compound film, the semiconductor in the second magnetic metal semiconductor compound film having a higher concentration than a concentration of the semiconductor in the first magnetic metal semiconductor compound film, the semiconductor in the third magnetic metal semiconductor compound film having a lower concentration than the concentration of the semiconductor in the second magnetic metal semiconductor compound film; and
    removing the third magnetic metal semiconductor compound film on the gate sidewall.

10. The method according to claim 9, further comprising forming the source and drain regions by introducing an impurity into the regions in the second semiconductor layer, the impurity being of the opposite conductivity type of a conductivity type of the first semiconductor layer.

11. The method according to claim 9, wherein the first magnetic metal semiconductor compound film is in contact with the insulating layer.

12. The method according to claim 9, further comprising:
removing the second magnetic metal semiconductor compound film on the first magnetic metal semiconductor compound film; and
forming a film stack including a magnetic layer over the first magnetic metal semiconductor compound film, the gate sidewall, and the gate electrode.

13. The method according to claim 12, further comprising oxidizing a portion of the film stack after the formation of the film stack, the portion of the film stack being located over the gate sidewall.

14. The method according to claim 12, further comprising:
forming a resist layer over the film stack after the formation of the film stack, and flattening an upper face of the resist layer;
removing the resist layer to expose a first portion of the film stack located over the gate electrode and a part of a second portion of the film stack located over the gate sidewall;
removing the first portion of the film stack and the part of the second portion of the film stack; and
oxidizing a remaining part of the second portion of the film stack located over the gate sidewall.

15. A semiconductor device comprising:
a semiconductor layer;
source and drain regions formed at a distance from each other in the semiconductor layer;
a magnetic metal semiconductor compound film formed on each of the source and drain regions, the magnetic metal semiconductor compound film including the same as a semiconductor of the semiconductor layer and a magnetic metal;
a gate insulating film formed on a portion of the semiconductor layer, the portion being located between the source region and the drain region;
a gate electrode formed on the gate insulating film;
a gate sidewall formed at a side portion of the gate electrode, the gate sidewall being made of an insulating material;
a film stack formed on the magnetic metal semiconductor compound film on each of the source and drain regions, the film stack including a magnetic layer; and
an oxide layer formed on the gate sidewall, the oxide layer containing the same element as an element in the film stack.

16. The device according to claim 15, wherein the magnetic metal semiconductor compound film is a magnetic-metal-rich semiconductor compound film.

17. The device according to claim 15, wherein the magnetic metal semiconductor compound film is also formed on the gate electrode.

18. The device according to claim 15, wherein the semiconductor layer is formed on an insulating layer.

19. The device according to claim 18, wherein the magnetic metal semiconductor compound film is in contact with the insulating layer.

20. The device according to claim 18, wherein the semiconductor layer has a Fin type shape.

* * * * *